United States Patent
Chiu

(12) 
(10) Patent No.: US 6,353,367 B1
(45) Date of Patent: Mar. 5, 2002

(54) CASCODE AMPLIFIER INTEGRATED CIRCUIT WITH REDUCED MILLER CAPACITANCE AT AN OUTPUT BUFFER STAGE DURING A TRANSIENT FALL RESPONSE

(75) Inventor: Hon Kin Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/615,527

(22) Filed: Jul. 13, 2000

(51) Int. Cl.$^7$ .............................. H03F 3/04; H03F 1/38; H03F 1/14; H03F 1/24
(52) U.S. Cl. ....................... 330/311; 330/291; 330/292; 330/100
(58) Field of Search ................ 330/291, 292, 330/98, 99, 100, 311

(56) References Cited

U.S. PATENT DOCUMENTS

| | | | | |
|---|---|---|---|---|
| 5,416,442 A | * | 5/1995 | Hobrecht | 330/291 |
| 5,479,133 A | * | 12/1995 | Dow | 330/267 |
| 5,680,173 A | * | 10/1997 | White et al. | 348/380 |
| 5,977,610 A | | 11/1999 | Chiu | 257/538 |

OTHER PUBLICATIONS

P.R. Gray and R.G. Meyer, *Analysis and Design of Analog Integrated Circuits*, Third Edition, 228–226, 464–466 and 511–513 (John Wiley & Sons, 1993).

U.S. application No. 09/615,293, Filed Jul. 13, 2000.

* cited by examiner

*Primary Examiner*—Robert Pascal
*Assistant Examiner*—Patricia T. Nguyen
(74) *Attorney, Agent, or Firm*—Girard & Equitz LLP

(57) ABSTRACT

A cascode amplifier integrated circuit (IC) with a relatively fast transient fall response (i.e., short transient fall response time) and, therefore, relatively fast operation. The cascode amplifier IC includes a bias input terminal configured to receive a bias potential $V_b$, a power supply input terminal configured to receive a power supply voltage $V_{cc}$, an input signal terminal configured to receive an input voltage signal $V_{in}$, and an output signal terminal. The cascode amplifier IC also includes a gain stage circuit with a plurality of interconnected bipolar transistors and an output buffer stage circuit configured. The cascode amplifier integrated circuit further includes a discharge circuit configured to discharge stray capacitance at a node of the output buffer stage circuit. The discharge circuit includes, for example, a bipolar discharge transistor (configured, for example, as an emitter-follower device) that reduces the Miller capacitance across the base and collector of one of the interconnected bipolar transistors of the output buffer stage circuit during a transient fall response. The discharging of the stray capacitance by the discharge circuit decreases the transient fall response time of the cascode amplifier IC and, thereby, increases its operation speed (that is, the discharge circuit provides for fast operation).

13 Claims, 3 Drawing Sheets

CASCODE AMPLIFIER INTEGRATED CIRCUIT WITH REDUCED MILLER CAPACITANCE AT AN OUTPUT BUFFER STAGE DURING A TRANSIENT FALL RESPONSE

BACKGROUND OF THE INVENTION

1. Field of the Invention

The present invention relates to integrated circuits and, in particular, to cascode amplifier integrated circuits.

2. Description of the Related Art

Amplifier integrated circuits (ICs) constitute one of the basic types of analog integrated circuits. Amplifier ICs are essentially configured to receive an input voltage signal ($V_{in}$), or input current signal, and, in response, provide a larger output voltage signal ($V_{out}$), or larger output current signal. Such amplifier ICs can be used, for example, as an audio power amplifier or to drive a cathode ray tube (CRT).

FIG. 1 is a simplified schematic simulation diagram of conventional cascode amplifier IC 10. The conventional cascode amplifier IC 10 is configured to assert an amplified output voltage signal $V_{out}$ (at output signal terminal 12) in response to input voltage signal $V_{in}$ (received at input signal terminal 14), when biased by bias potential $V_b$ (also referred to as a bias voltage and received at bias input terminal 16) and provided with power supply voltage $V_{cc}$ (received at power supply input terminal 18).

Conventional cascode amplifier IC 10 includes an input buffer stage circuit 30 that includes bipolar transistor X8 and resistor R5, a gain stage circuit 32 that includes bipolar transistors X6 and X7 and resistor R2, an output buffer stage circuit 34 that includes interconnected bipolar transistors X0, X1, X2, and X3, and a bias stage circuit 36 that includes two diodes D1 and D2. In the conventional cascode amplifier IC 10 of FIG. 1, a stray capacitance (represented by dashed stray capacitor 1) is inherently present at node al3 of the output buffer stage circuit 34. Resistors R1$a$ and R1$b$ of conventional cascode amplifier IC 10 constitute a collector load resistor of the gain stage circuit 32.

One skilled in the art will recognize that FIG. 1 is representative of a variety of well known conventional cascode amplifier IC configurations. Further descriptions of cascode amplifier ICs are found in U.S. Pat. No. 5,977,610 to Hon Kin Chiu, P. R. Gray and R. G. Meyer, *Analysis and Design of Analog Integrated Circuits, Third Edition,* 225–226, 464–466 and 511–513 (John Wiley & Sons, 1993), and U.S. patent application Ser. No. 09/615,293, filed on Jul. 13, 2000, by Peyman Hojabri et al., entitled "Cascode Amplifier Integrated Circuit With Frequency Compensation Capability," each of which is hereby fully incorporated by reference.

A drawback of conventional cascode amplifier ICs is a slow transient fall response (i.e., a relatively long transient fall response time) due to a relatively slow discharging of the stray capacitance at a node of the output buffer stage (such as at node al3 of output buffer stage circuit 34 in FIG. 1). The relatively slow discharging of this node is worsened when the collector load resistance of the gain stage (e.g., resistors R1$a$ and R1$b$ in FIG. 1) is large (e.g, 6000 ohms). Still needed in the field, therefore, is a cascode amplifier integrated circuit that provides for a relatively fast transient fall response (i.e., a relatively short transient fall response time) and, therefore, relatively fast operation.

SUMMARY OF THE INVENTION

The present invention provides a cascode amplifier integrated circuit (IC) with a relatively fast transient fall response and, therefore, a relatively fast operation. A cascode amplifier IC according to the present invention includes a bias input terminal configured to receive a bias potential $V_b$, (e.g., a 12 volt bias voltage), a power supply input terminal configured to receive a power supply voltage $V_{cc}$ (e.g., an 150 volt power supply signal), an input signal terminal configured to receive an input voltage signal $V_{in}$, and an output signal terminal. The cascode amplifier IC also includes a gain stage circuit and an output buffer stage circuit. The output buffer stage circuit includes a plurality of interconnected bipolar transistors. The gain stage circuit is configured to amplify the input voltage signal received at the input signal terminal and to, thereby, produce an amplified voltage signal, while the output buffer stage circuit is configured to receive the amplified voltage signal from the gain stage circuit, increase the current thereof and transmit the resultant amplified voltage signal with increased current to the output signal terminal as an amplified output voltage signal. The cascode amplifier IC further includes a discharge circuit configured to discharge stray capacitance at a node of the output buffer stage circuit. The discharge circuit includes, for example, a bipolar discharge transistor (configured, for example, as an emitter follower device) that reduces the Miller capacitance across the base and collector of one of the interconnected bipolar transistors of the output buffer stage circuit during a transient fall response. The discharging of the stray capacitance by the discharge circuit decreases the transient fall response time of the cascode amplifier IC and, thereby, increases its operation speed.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

Figure 1:
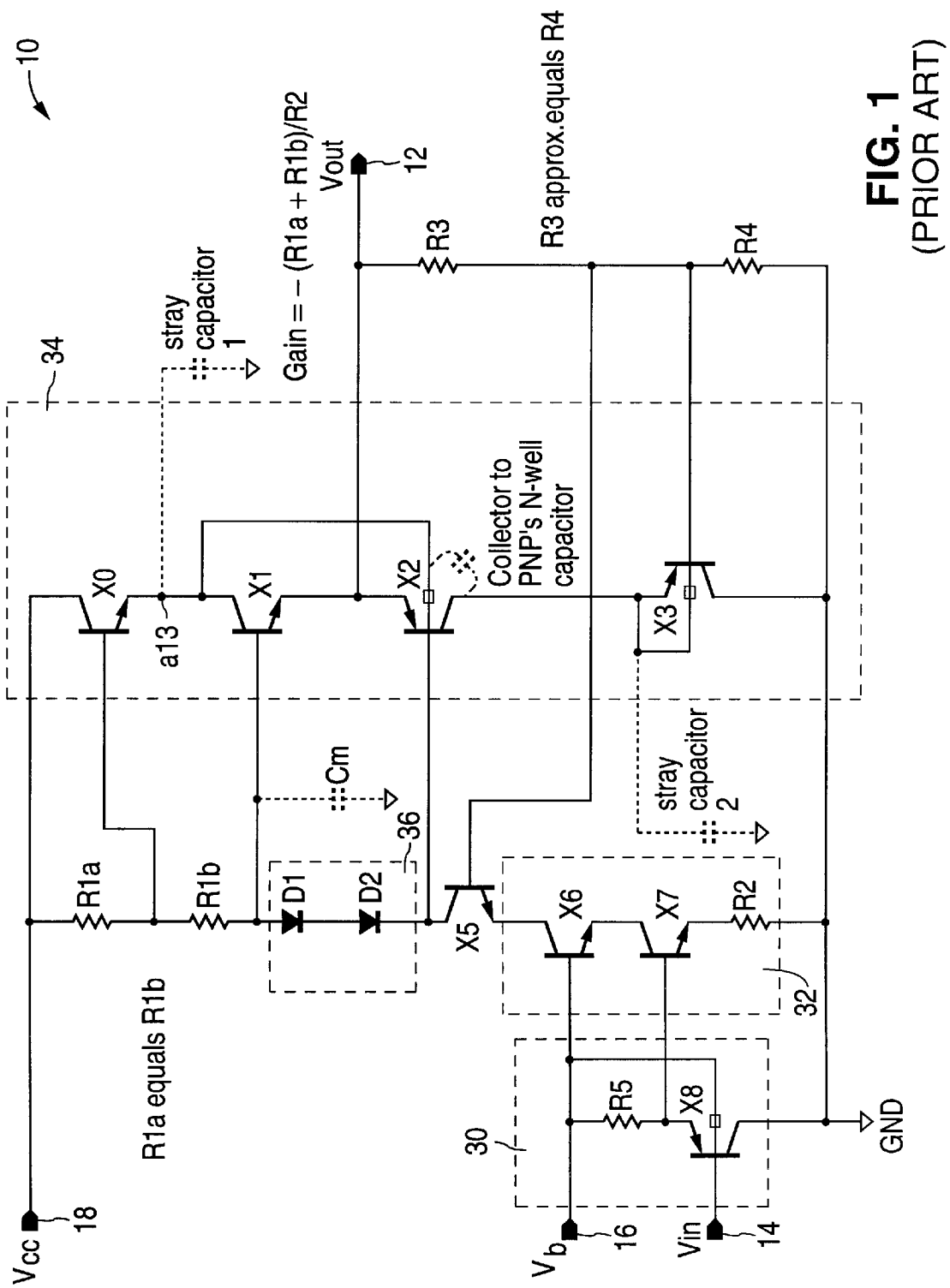
FIG. 1 is a simplified electrical schematic for a conventional cascode amplifier IC. The dashed rectangles indicate the essential boundaries of various circuits within the conventional cascode amplifier IC, while dashed elements represent parasitics.
Figure 2:
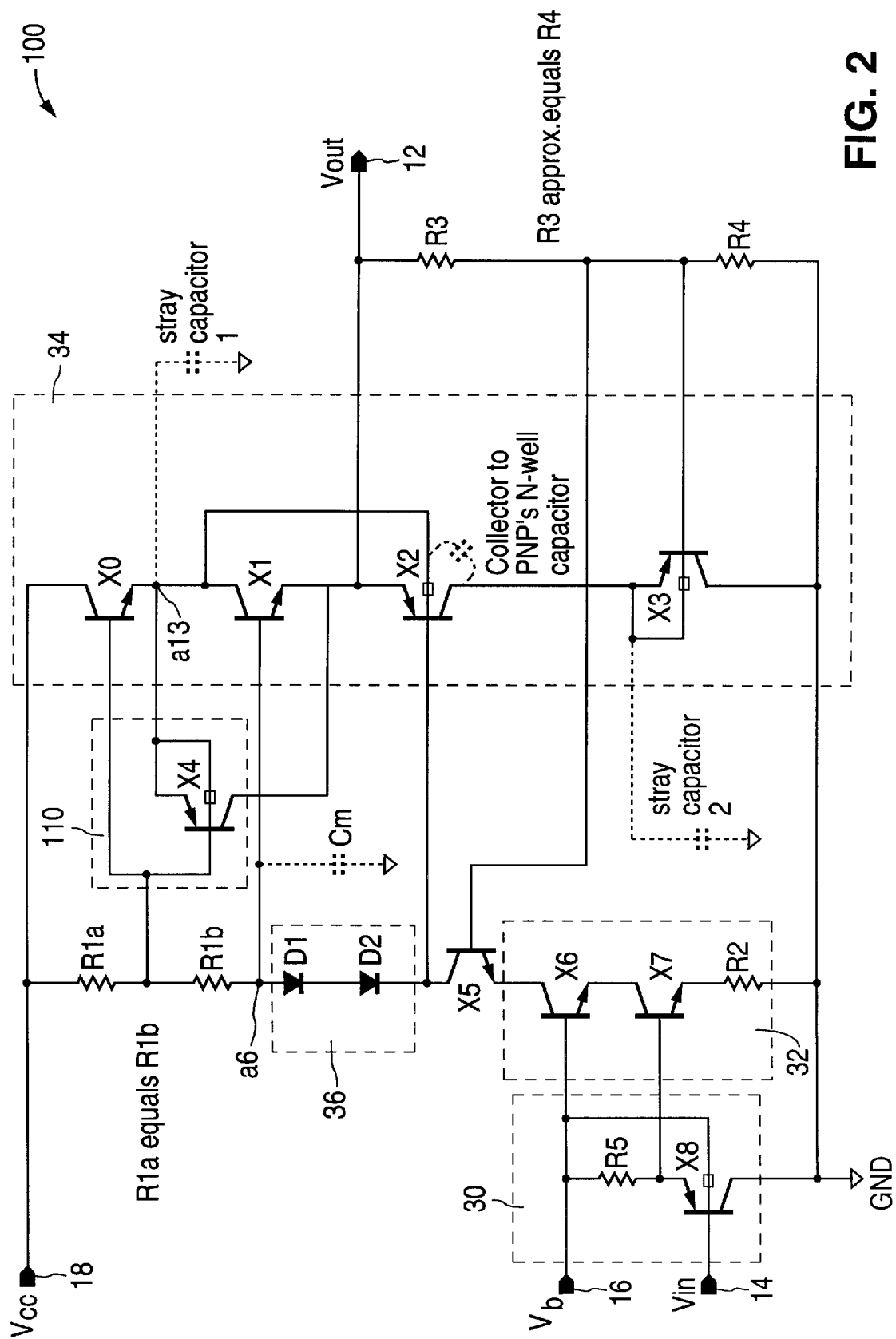
FIG. 2 is a simplified electrical schematic for cascode amplifier IC in accordance with the present invention. The dashed rectangles indicate the essential boundaries of various circuits within the cascode amplifier IC, while dashed elements represent parasitics.

FIG. 2 illustrates a cascode amplifier IC 100 according to the present invention. In FIG. 2, like numerals are employed to indicate like elements from FIG. 1 and parasitics are indicated by dashed elements. Cascode amplifier IC 100 is configured to assert an amplified output voltage signal $V_{out}$ (at output signal terminal 12) in response to input voltage signal $V_{in}$ in (received at input signal terminal 14), when biased by bias potential $V_b$ (also referred to as a bias voltage, received at bias input terminal 16) and provided with power supply voltage $V_{cc}$ (also referred to as a power supply voltage and received at power supply input terminal 18).

Bias potential $V_b$ can be, for example, a 12 volt bias potential. The input voltage signal $V_{in}$ can be, for example, an input signal from a video pre-amplifier in the range of from 1.4 volts to 4.2 volts. The power supply voltage $V_{cc}$ can be, for example, a 150 volt power supply voltage.

Cascode amplifier IC 100 also includes an input buffer stage circuit 30 that includes bipolar transistor X8 and resistor R5, a gain stage circuit 32 that includes bipolar transistors X7 (a gain bipolar transistor) and X6 (a cascode bipolar transistor configured to increase the band width of the gain stage circuit 32), an output buffer stage circuit 34 that includes interconnected bipolar transistors X0, X1, X2 and X3, and a bias stage circuit 36 that includes two diodes D1 and D2. Input buffer stage circuit 30 is configured to receive an input voltage signal from the input signal terminal 14 and transmit that input voltage signal to the gain stage circuit 32. Input buffer stage circuit 30 is also configured to minimize current loading on an electronic device (e.g., video pre-amplifier) that supplies the input voltage signal. Gain stage circuit 32 is configured to provide a gain (i.e., amplification), for example, of −26. Bias stage circuit 36 is configured to set the quiescent current (i.e., static current) of the output buffer stage circuit 34.

In FIG. 2, the output buffer stage circuit 34 is configured as an NPN-PNP push-pull output buffer stage circuit. Since the gain stage circuit 32 is configured to only amplify the input voltage signal ($V_{in}$), the current of the amplified output voltage signal ($V_{out}$) may not be sufficient to drive an electronic device (e.g., a CRT) connected to the output signal terminal 12. The output buffer stage circuit 34 is, therefore, configured to isolate the electronic device from the gain stage circuit 32 and supply additional current to the output voltage signal. The gain of the output buffer stage circuit 34 is, however, 1.

Cascode amplifier IC 100 also includes a discharge circuit 110 configured to reduce the Miller capacitance across the base and collector of bipolar transistor X1 by discharging stray capacitance at node a13 of the output buffer stage circuit. Discharge circuit 110 includes a bipolar discharge transistor X4, which is configured to reduce the Miller capacitance across the base and collector of bipolar transistor X1 during a transient fall response. Bipolar discharge transistor X4 essentially acts as an emitter-follower device to node a13 of the output buffer stage circuit 34. In doing so, bipolar discharge transistor X4 effectively reduces the Miller capacitance across the base and collector of bipolar transistor X1 to one half of what the Miller capacitance would be in the absence of discharge circuit 110. As a result of this reduction in Miller capacitance, node a13 as well as node a6 discharge faster and the transient fall response time of cascode amplifier ICs in accordance with the present invention is reduced.

Figure 3:
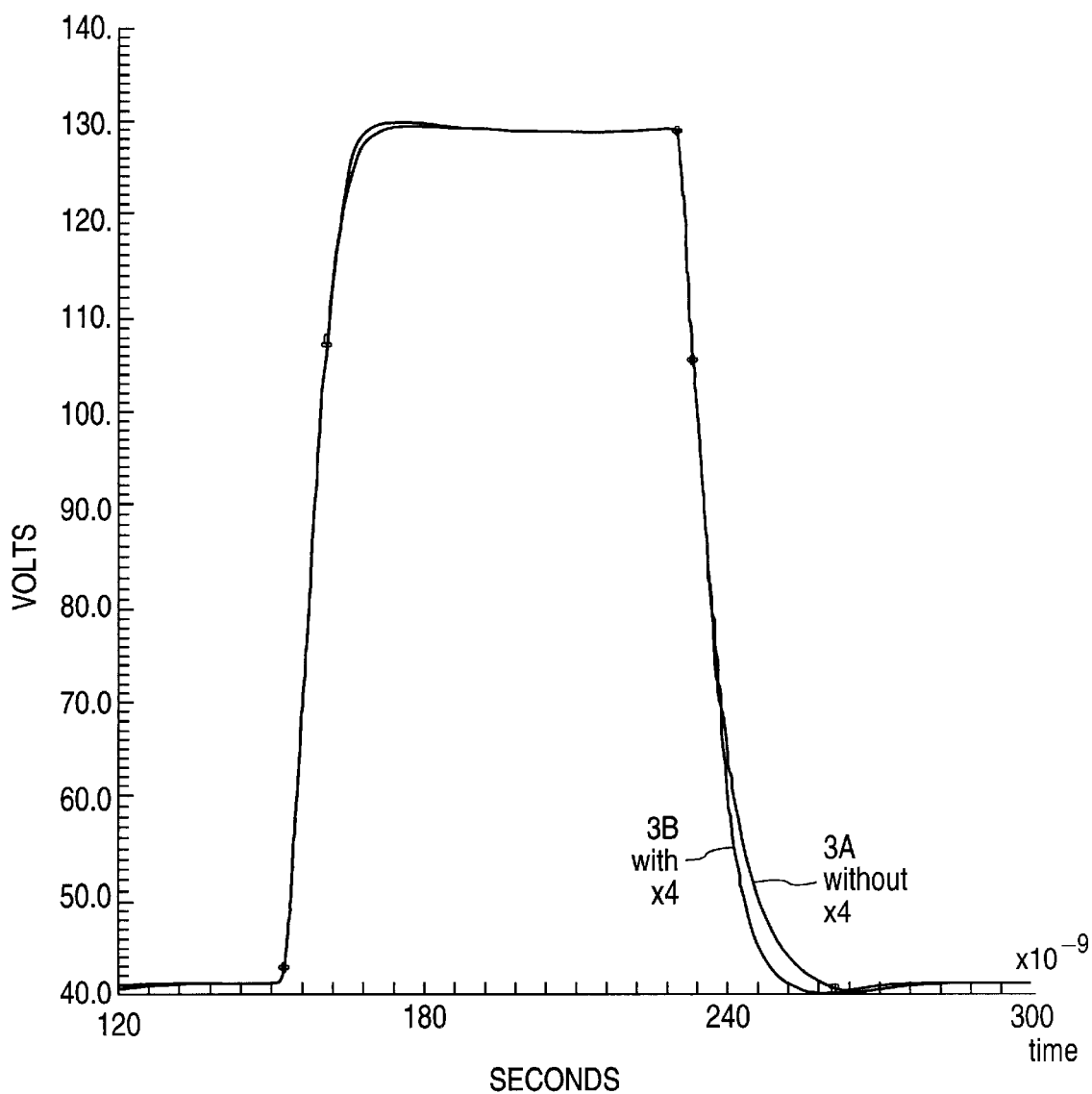
FIG. 3 depicts the transient rise and fall time response for the conventional cascode amplifier IC of FIG. 1 and for the present cascode amplifier IC of FIG. 2.

FIG. 3 depicts the transient rise and fall responses for the conventional cascode amplifier IC 10 of FIG. 1 (see curve 3A), as well as for the cascode amplifier IC 110 of FIG. 2 in accordance with the present invention (see curve 3B). Based on FIG. 3, cascode amplifier IC 100 according to the present invention has a transient fall response that is significantly faster than the transient fall response of the conventional cascode amplifier IC 10. This result indicates that cascode amplifier ICs in accordance with the present invention operates at a higher speed than conventional cascode amplifier ICs.

It should be understood that various alternatives to the embodiments of the invention described herein may be employed in practicing the invention. It is intended that the following claims define the scope of the invention and that structures within the scope of these claims and their equivalents be covered thereby.

What is claimed is:

1. A cascode amplifier integrated circuit comprising:
    a bias input terminal configured to receive a bias voltage;
    a power supply input terminal configured to receive a power supply voltage;
    an input signal terminal configured to receive an input voltage signal;
    an output signal terminal;
    a gain stage circuit configured to amplify the input voltage signal received at the input signal terminal to produce an amplified voltage signal;
    an output buffer stage circuit configured to receive the amplified voltage signal from the gain stage circuit, to increase the current of the received amplified voltage signal and to transmit the resultant amplified voltage signal with increased current to the output signal terminal as an amplified output voltage signal, wherein the output buffer stage circuit includes a first node and a plurality of bipolar transistors, wherein the first node, the output signal terminal, and the emitters and collectors of at least two of the bipolar transistors are connected in series; and
    a discharge circuit configured to discharge stray capacitance at the first node of the output buffer stage circuit.

2. The cascode amplifier integrated circuit of claim 1, wherein the discharge circuit discharges the stray capacitance at the first node during a transient fall response of the cascode amplifier integrated circuit.

3. The cascode amplifier integrated circuit of claim 1, wherein the discharge circuit includes a bipolar discharge transistor coupled to the first node.

4. The cascode amplifier circuit of claim 3, wherein the bipolar discharge transistor is configured as an emitter-follower device.

5. The cascode amplifier integrated circuit of claim 1, wherein the discharge circuit reduces the Miller capacitance across the base and collector of one of said at least two of the bipolar transistors of the output buffer stage circuit by discharging the stray capacitance at the first node.

6. The cascode amplifier circuit of claim 5, wherein said Miller capacitance is reduced by one half.

7. A cascode amplifier integrated circuit comprising:
    a bias input terminal configured to receive a bias voltage;
    a power supply input terminal configured to receive a power supply voltage;
    an input signal terminal configured to receive an input voltage signal;
    an output signal terminal;
    a gain stage circuit configured to amplify the input voltage signal received at the input signal terminal to produce an amplified voltage signal;
    an output buffer stage circuit configured to receive the amplified voltage signal from the gain stage circuit, to increase the current of the received amplified voltage signal and to transmit the resultant amplified voltage signal with increased current to the output signal terminal as an amplified output voltage signal, the output buffer stage circuit including a plurality of interconnected bipolar transistors;
    a discharge circuit configured to discharge stray capacitance at a node of the output buffer stage circuit;
    an input buffer stage circuit configured to receive the input voltage signal from the input signal terminal and transmit the received input voltage signal to the gain stage circuit, the input buffer stage circuit also being configured to minimize current loading on an electronic device supplying the input voltage signal; and a bias stage circuit configured to set the quiescent current of the output buffer stage circuit.

8. The cascode amplifier integrated circuit of claim 1, wherein the gain stage circuit includes a plurality of bipolar gain stage transistors in a cascode configuration.

9. The cascode amplifier integrated circuit of claim 8, wherein the bipolar gain stage transistors include at least one bipolar gain transistor and at least one bipolar cascode transistor.

10. A cascode amplifier integrated circuit, comprising:

a gain stage circuit having a cascode configuration, wherein the gain stage circuit is coupled to receive an input voltage and a bias voltage and is configured to amplify the input voltage in response to the bias voltage to produce an amplified signal having an amplified voltage;

an output buffer stage circuit coupled to the gain stage circuit, wherein the output buffer stage has an output node, a first node having a stray capacitance, and a plurality of bipolar transistors, wherein the first node, the emitters and collectors of at least two of the bipolar transistors, and the output node are connected in series, and wherein the output buffer stage is configured to maintain the output node at an output potential determined by the amplified voltage even when a load coupled to the output node draws an output current from said output node; and a discharge circuit coupled to the first node and configured to discharge the stray capacitance at said first node.

11. The cascode amplifier integrated circuit of claim 10, wherein the discharge circuit is configured to discharge the stray capacitance at the first node during a transient fall response of the cascode amplifier integrated circuit.

12. The cascode amplifier integrated circuit of claim 11, wherein the discharge circuit includes a bipolar discharge transistor coupled to the first node and configured as an emitter-follower device.

13. The cascode amplifier integrated circuit of claim 12, wherein one of said at least two of the bipolar transistors has a base, a collector, and a Miller capacitance across the base and the collector, and wherein the discharge circuit is configured to reduce said Miller capacitance during said transient fall response.

* * * * *